United States Patent
Dubhashi et al.

[11] Patent Number: 5,900,714
[45] Date of Patent: May 4, 1999

[54] CIRCUIT FOR SENSING MOTOR LOAD CURRENT

[75] Inventors: Ajit Dubhashi, El Segundo; Stefano Clemente, Rolling Hills; Christopher C. Chey, Redondo Beach, all of Calif.

[73] Assignee: International Rectifier Corporation, El Segundo, Calif.

[21] Appl. No.: 08/963,936

[22] Filed: Nov. 4, 1997

Related U.S. Application Data

[60] Provisional application No. 60/030,068, Nov. 8, 1996.

[51] Int. Cl.⁶ .................................................. H02P 5/28
[52] U.S. Cl. ............................................................ 318/811
[58] Field of Search .................... 318/254, 798, 318/801, 805, 806, 808, 811

[56] References Cited

U.S. PATENT DOCUMENTS

| | | | |
|---|---|---|---|
| 4,641,075 | 2/1987 | Asano et al. | 318/811 |
| 5,017,855 | 5/1991 | Byers et al. | 318/811 |
| 5,072,354 | 12/1991 | Katto et al. | 318/811 |
| 5,079,494 | 1/1992 | Reichard | 318/811 |
| 5,198,733 | 3/1993 | Wright | 318/254 |
| 5,204,594 | 4/1993 | Carobolante | 318/254 |
| 5,349,351 | 9/1994 | Obara et al. | 318/811 |

FOREIGN PATENT DOCUMENTS

| | | |
|---|---|---|
| 2190754 | 11/1987 | United Kingdom . |
| 2272300 | 5/1994 | United Kingdom . |
| 2277214 | 10/1994 | United Kingdom . |

*Primary Examiner*—William M. Shoop, Jr.
*Assistant Examiner*—Rina Duda
*Attorney, Agent, or Firm*—Ostrolenk, Faber, Gerb & Soffen, LLP

[57] ABSTRACT

A current sensing circuit including a shunt resistor coupled, at one end, to the low-side transistor of a half bridge circuit and, at its other end, to a load. The voltage sensed across the shunt resistor is proportional to the current delivered to the load. A level shifting circuit is provided to transpose the sensed voltage to a low voltage signal which can be fed back to control commutation of the transistors in the half bridge circuit.

10 Claims, 4 Drawing Sheets

# CIRCUIT FOR SENSING MOTOR LOAD CURRENT

CROSS REFERENCE TO RELATED APPLICATION

This application is based on and claims priority to United States Provisional Patent Application No. 60/030,068, filed Nov. 8, 1996, entitled CIRCUIT FOR SENSING MOTOR LOAD CURRENT.

BACKGROUND OF THE INVENTION

1. Field of the Invention

The present invention relates to a circuit for sensing current in a motor controller, an uninterruptable power supply or any system that uses a half bridge circuit and, more specifically, to a circuit for sensing load current by sensing a shunt voltage and transmitting that information to ground level.

2. Description of the Related Art

Resistive shunts are widely used as inexpensive circuit elements for sensing the current passing through a device. The shunt is placed in series with the device for which current is to be sensed. Thus, the voltage drop across the shunt is proportional to current flowing through the shunt and the device.

FIG. 1 shows a typical prior art circuit using a resistive shunt for sensing current through a motor driven by a three phase motor controller. The total current of the three phase currents, $i_a$, $i_b$, and $i_c$, is sensed by sensing the voltage across a common shunt resistor R. This single voltage level is then "decomposed" into the three motor currents of $i_a$, $i_b$, and $i_c$ using mathematical techniques in the microprocessor 10 using information such as when each switch in the motor controller is ON.

The disadvantage of the above-described method for sensing load current is that it fails under certain load and speed conditions, and thus is not a robust method.

Another method of sensing load current is to use Hall effect devices to sense the current flow in each phase, as shown in FIG. 2. In this method, each of the Hall effect devices 20, 22 and 24 measures the flux created by the motor current in its respective phase. The disadvantage of using Hall effect devices is that such devices are expensive.

Another scheme that can be adopted to sense load current in a motor controller circuit (shown in FIG. 3 for one of the three phases) is to add a resistor 30 in series between the low side switch and ground. The voltage across resistor 30 is sensed and a sample and hold (S/H) element 32 is used to reconstruct the waveform.

The disadvantages of the scheme shown in FIG. 3 are as follows:

1. the resistor 30 has a parasitic inductance 34 (shown in series with the resistance) which causes a large voltage spike at each turn-on and turn-off instant of the waveform (FIG. 3A). The amplitude of this spike can be as high as 100 times the signal value;

2. the waveform is inherently "choppy;"

3. the voltage spike caused by inductance 34 of resistor 30 can destroy the driver 36 if there is a short circuit on the high side switch; and 4. although the above problems may be minimized using a resistor, R, having a low parasitic inductance, such resistors are very expensive.

SUMMARY OF THE INVENTION

The present invention is directed to a current sense circuit employing a resistive shunt which avoids the disadvantages associated with the prior art schemes shown in FIGS. 1–3 and described above.

In order to overcome the disadvantages of the prior art, the present invention provides a current sensing circuit which includes a resistive shunt adapted to be coupled, at its one end, to the junction of a half bridge, high-side, low-side transistor pair and, at its other end, to a load such that a sensed voltage across the shunt is proportional to the current delivered to the load; and a level shifting circuit adapted to transpose a reference point of the sensed voltage to a lower potential node in the circuit such that a feedback voltage is produced from the sensed voltage which may be used to control commutation of the half bridge transistors.

BRIEF DESCRIPTION OF THE DRAWINGS

For the purpose of illustrating the invention, there is shown in the drawing forms which are presently preferred, it being understood, however, that the invention is not limited to the precise arrangements and instrumentalities shown.

DETAILED DESCRIPTION OF THE PREFERRED EMBODIMENTS

Figure 1:
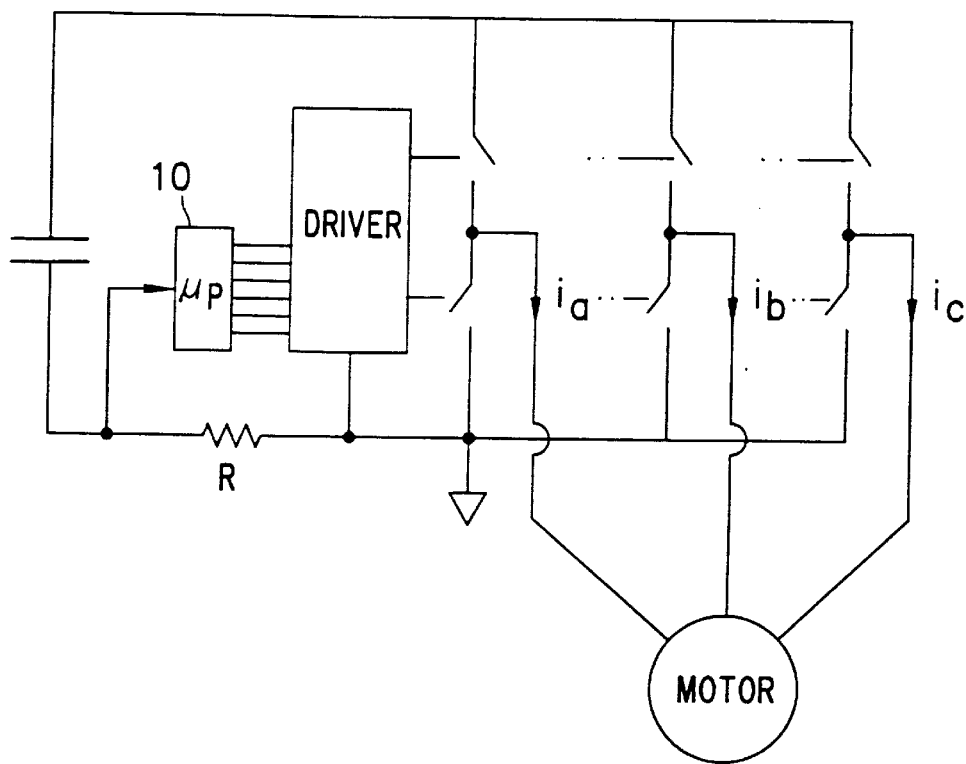
FIG. 1 shows a prior art circuit using a single resistive shunt to sense current flowing through a motor driven by a three phase motor controller.
Figure 2:
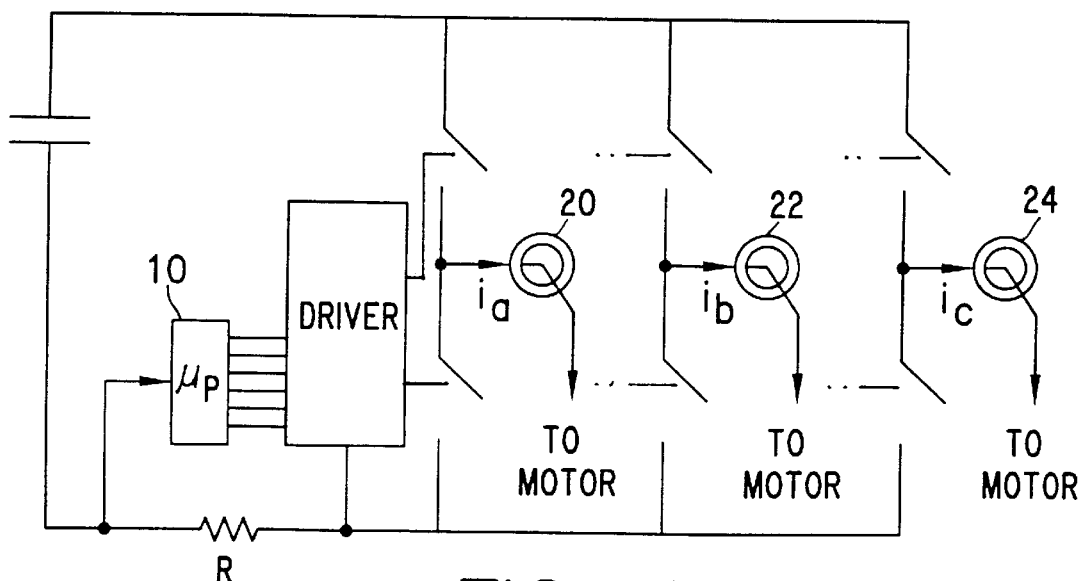
FIG. 2 shows an alternative prior art circuit for sensing motor current using Hall effect devices.
Figure 3:
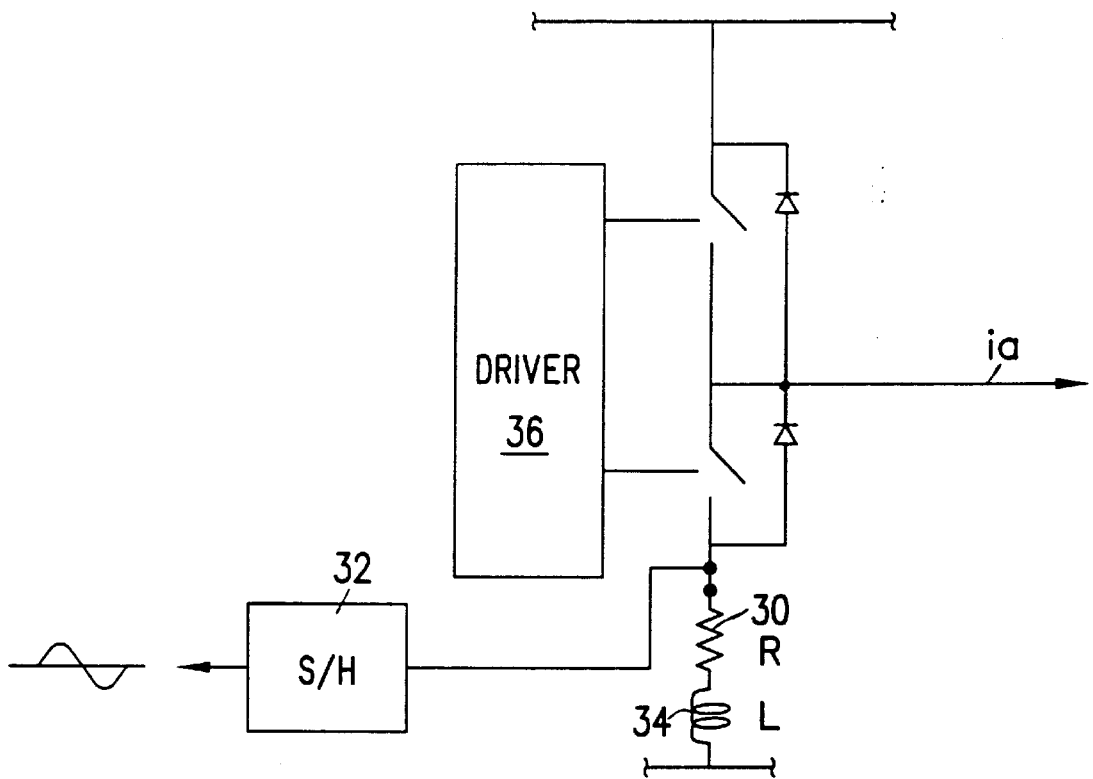
FIG. 3 shows a third prior art circuit for sensing current flowing through a motor.
Figure 3A:
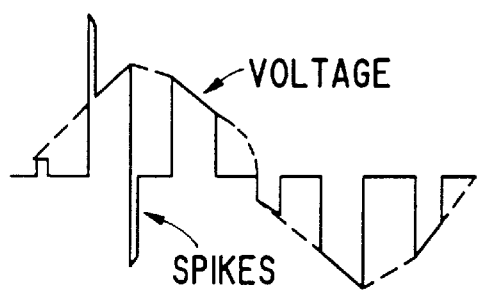
FIG. 3a shows a sensed voltage waveform for the circuit of FIG. 3.
Figure 4:
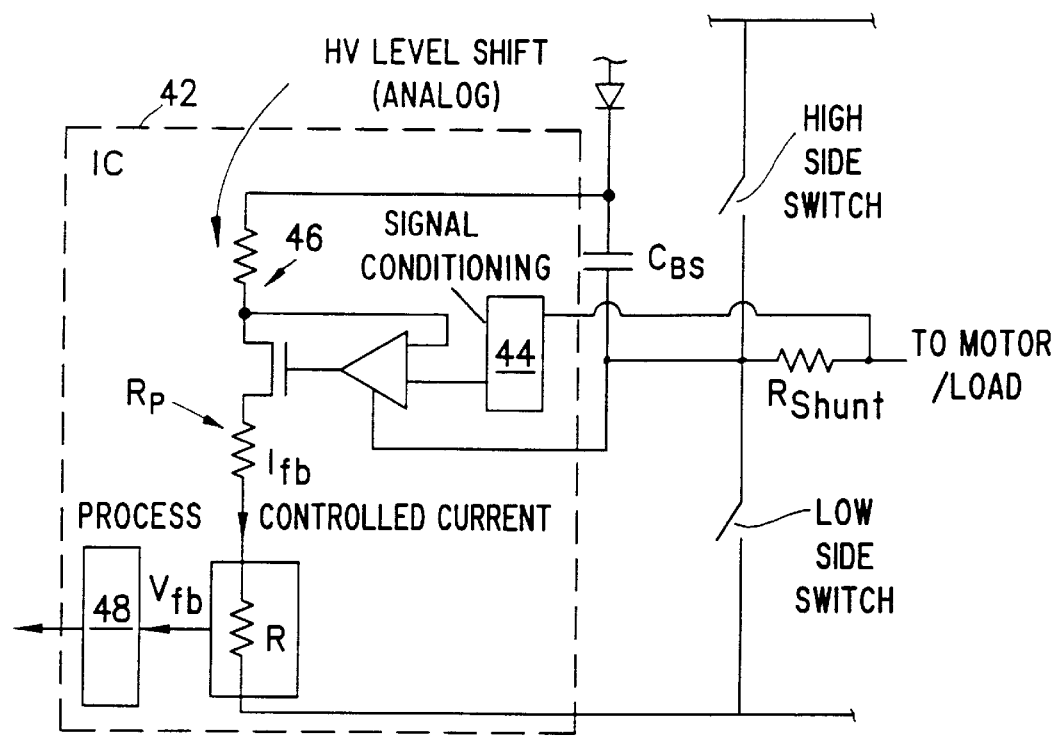
FIG. 4 shows a first embodiment of the circuit of the present invention.

A first embodiment of the present invention is shown in FIG. 4. As shown therein, a shunt resistor, $R_{shunt}$, is placed from the junction of high-side and low-side transistors in a half bridge circuit to the load, such as a motor or the like. A voltage drop $V_S$ is developed across a resistor $R_{shunt}$ which represents the current flowing through the load (for example, one phase of a motor winding).

The voltage $V_S$, unlike the prior art, is not "choppy," but substantially smoother (although possibly noisy) because the shunt is directly in series with the load and, therefore, carries the current from both switches. The voltage $V_S$, however, is referenced to the junction of the high-side and low-side switches. That junction is also the reference point of a high-side (or high voltage) supply line which is used to provide a voltage sufficiently high to turn on the high-side transistor.

In order for a control circuit (not shown) to utilize the sensed voltage $V_S$ to control the commutation of the switches, the voltage $V_S$ must be referenced to ground potential.

The voltage across $R_{shunt}$ is processed into a current sense signal by an integrated circuit (IC) 42, which includes signal conditioning circuitry, high voltage level shift circuitry, and signal processing circuitry. Specifically, the voltage across $R_{shunt}$ is first sent to signal conditioning block 44 of IC 42, which conditions the signal by filtering, clamping and adding a offset voltage to the signal.

The conditioned signal is fed to a high voltage analog level shift circuit 46, which consists of a comparator driving an FET (with current supplied from a bootstrap capacitor $C_{BS}$) in the configuration shown in FIG. 4.

As will be apparent to those of skill in the art, high voltage analog level shift circuit 46 produces a controlled current $I_{fb}$ through a resistor $R_P$ to yield a voltage which is proportional to the conditioned signal $V_S$. Controlled current $I_{fb}$ then passes in series through a resistor R, having a stable value, to develop a voltage $V_{fb}$, which is post processed in processing block 48 to produce a signal having predetermined parameters (e.g., about a 2.5 V center voltage, etc.). The resultant signal, which represents the current flowing into the motor, is then output from IC 42.

One disadvantage of circuit shown in FIG. 4 and described above is that any significant current through the level shifter 46 causes excessive power dissipation in IC chip 42. This can be avoided by disposing $R_P$ outside the chip. Another disadvantage of the circuit shown in FIG. 4 is that bootstrap capacitor $C_{BS}$ which supplies the current $I_{fb}$ can be depleted very quickly if the current is significant.

Figure 5:
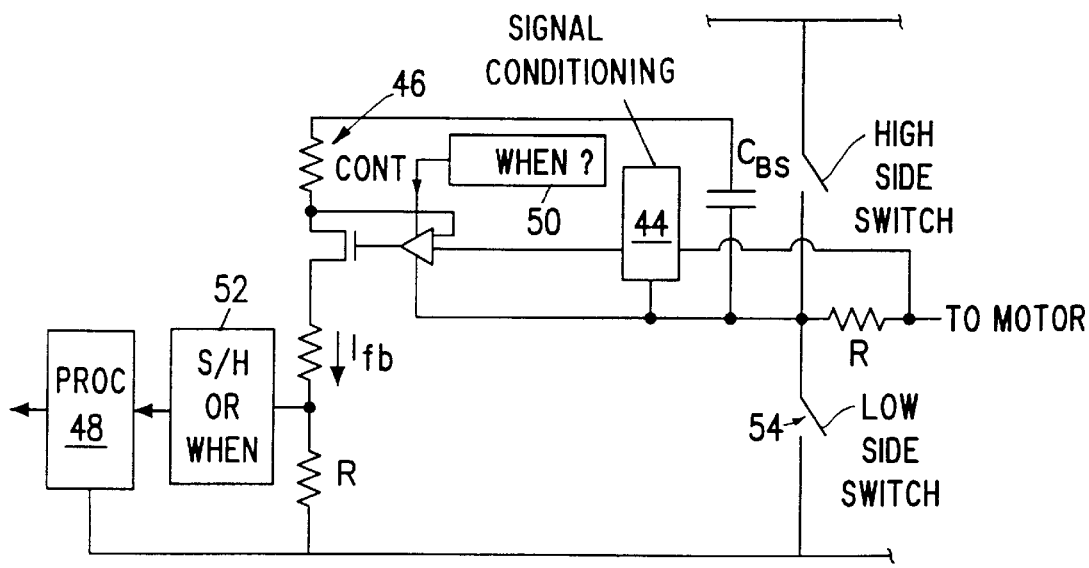
FIG. 5 shows an alternative circuit of the first embodiment which includes internal gating to prevent undesirable power dissipation when the low side switch of the motor controller is off.

The alternative circuit shown in FIG. 5 avoids the above noted problems. The circuit of FIG. 5 is similar to the circuit of FIG. 4 except for the addition of the WHEN circuit 50 and (S/H or not-WHEN) circuit 52. The WHEN circuit 50 (which can be implemented in any of a number of ways as will be apparent to those of skill in the art having viewed this disclosure) permits $I_{fb}$ to flow only when the low side transistor 54 of the motor controller circuit is on. (The status of low side transistor 54 (on or off) can be easily detected in a conventional manner).

The S/H or not-WHEN circuit 52 samples the voltage level across resistor R and holds that level during the time when the low-side switch is off to insure a smooth feedback voltage is delivered to, for example, the post processing circuit 48.

By halting the flow of current $I_{fb}$ when the low side transistor switch 54 is off, the power dissipation in resistor $R_P$ is minimized and the charge on bootstrap capacitor $C_{BS}$ is maintained.

Figure 6:
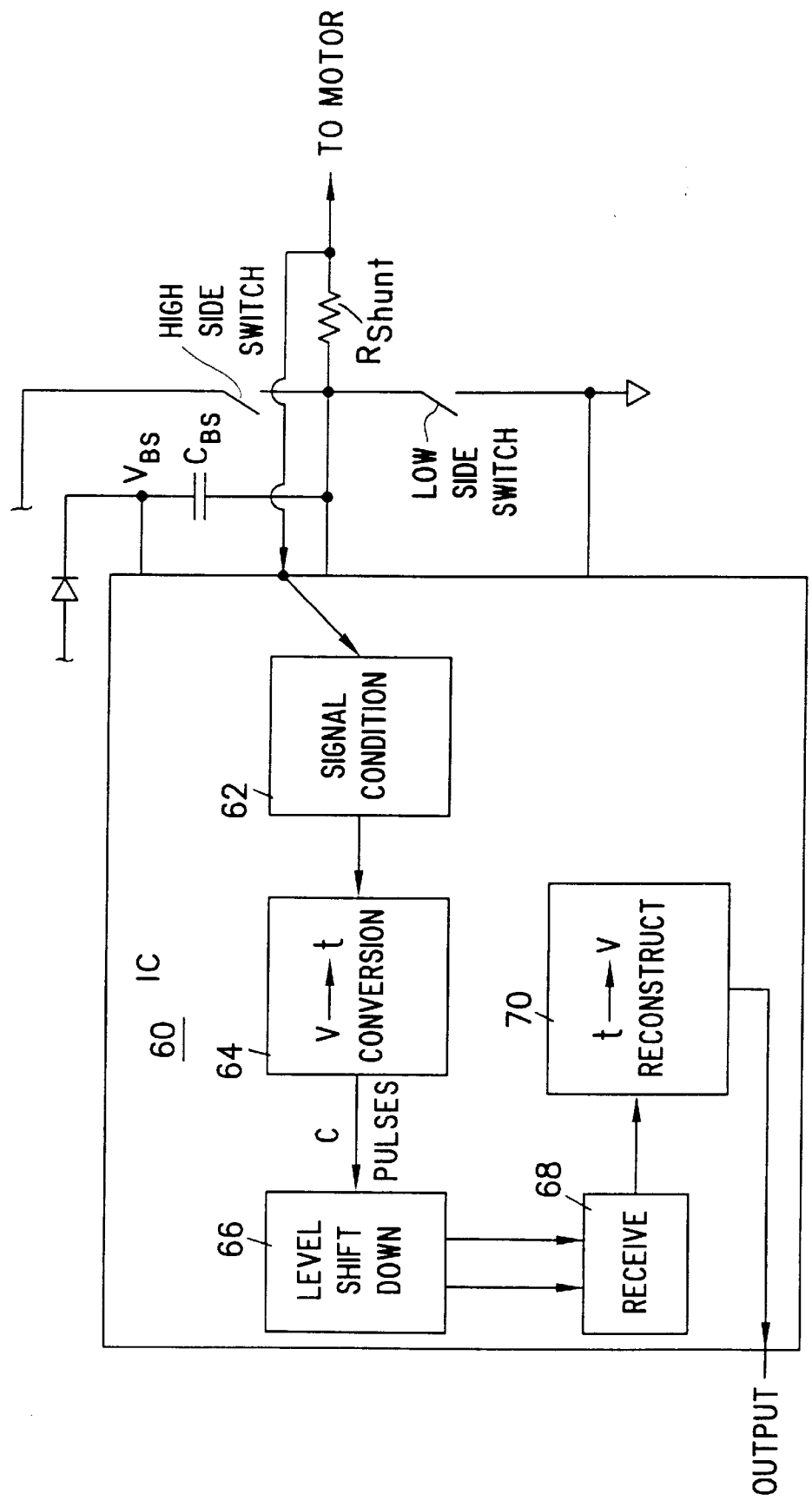
FIG. 6 shows a second embodiment of the present invention, which is a digital implementation of the current sense circuit of the present invention.

FIG. 6 shows the circuit of a second embodiment of the present invention, which is essentially a digital implementation of the first embodiment. As in the first embodiment, a voltage drop $V_s$ developed across a resistor $R_{shunt}$ is used to sense current flowing to a motor through a high voltage supply line in a motor controller circuit.

The negative high voltage across $R_{shunt}$ is processed into a current sense signal by an integrated circuit (IC) 60, which includes signal conditioning block 62, voltage-to-time conversion block 64, level shift down block 66, receive block 68 and time-to-voltage reconstruct block 70. Specifically, in the circuit of the second embodiment, the voltage across $R_{shunt}$ is first sent to signal conditioning block 62 of IC 60 as in the first embodiment.

The conditioned signal is fed to voltage-to-time conversion block 64, which converts the conditioned high voltage signal to a series of digital pulses representative of the amplitude of the voltage signal (e.g., by varying pulse frequency or pulse width in accordance with voltage amplitude). The pulses generated by block 64 are sent to level shift down block 66, which converts the pulses from a floating signal referenced to VS to a ground-referenced signal, and sends the converted pulses to receive (buffer) block 68. The digital pulses are then forwarded to time-to-voltage reconstruct block 70 which reconstruct the analog signal representative of the current flowing to the motor.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A current sensing circuit, comprising:
   a resistive shunt adapted to be coupled, at its one end, to the junction of a half bridge, high-side, low-side transistor pair and, at its other end, to a load such that a sensed voltage across the shunt is proportional to the current delivered to the load; and
   a level shifting circuit adapted to transpose the sensed voltage to a lower potential referenced to ground, such that a feedback voltage is produced from the sensed voltage which may be used to control commutation of the half bridge transistors.

2. The current sensing circuit of claim 1, wherein the level shifting circuit comprises:
   a high voltage analog level shift circuit adapted to convert the sensed voltage into a feedback current; and
   a resistive circuit having a first terminal and a second terminal, the first terminal of the resistive circuit being operatively coupled to ground and the second terminal being operatively coupled to the high voltage analog level shift circuit such that the feedback voltage is produced in response to the feedback current.

3. The current sensing circuit of claim 1, further comprising a post processing circuit adapted to convert the feedback voltage into a voltage having a predetermined center voltage.

4. The current sensing circuit of claim 3, wherein the center voltage is about 2.5 volts.

5. The current sensing circuit of claim 1, further comprising a sample and hold circuit adapted to sample the feedback voltage when the low-side transistor is on and produce an output voltage which is substantially the same as the sampled feedback voltage when the low-side transistor is off.

6. The current sensing circuit of claim 2, further comprising a sample and hold circuit adapted to sample the feedback voltage when the low-side transistor is on and produce an output voltage which is substantially the same as the sampled feedback voltage when the low-side transistor is off.

7. The current sensing circuit of claim 1, further comprising a voltage-to-time conversion circuit adapted to receive the sensed voltage and produce an intermediate signal comprising a series of high voltage pulses representative of the amplitude of the sensed voltage.

8. The current sensing circuit of claim 7, wherein the pulses comprising the intermediate signal have one of a variable frequency and a variable width.

9. The current sensing circuit of claim 7, wherein the level shift circuit is adapted to convert the high voltage pulses of the intermediate signal to digital level pulses.

10. The current sensing circuit of claim 9, further comprising a time-to-voltage converter circuit adapted to reconstruct an analog version of the sensed voltage to produce the feedback voltage.

* * * * *